(12) United States Patent
Gao

(10) Patent No.: US 11,602,041 B2
(45) Date of Patent: Mar. 7, 2023

(54) COOLING PACKAGES FOR HETEROGENOUS CHIPS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 5 days.

(21) Appl. No.: 17/170,411

(22) Filed: Feb. 8, 2021

(65) Prior Publication Data
US 2022/0256684 A1    Aug. 11, 2022

(51) Int. Cl.
*H05K 7/20* (2006.01)
*H05K 1/02* (2006.01)

(52) U.S. Cl.
CPC ....... *H05K 1/0203* (2013.01); *H05K 7/20509* (2013.01); *H05K 7/20709* (2013.01); *H05K 7/2029* (2013.01); *H05K 7/20809* (2013.01)

(58) Field of Classification Search
CPC ............. H05K 7/2039; H05K 7/20445; H05K 7/2049; H05K 7/20509; H05K 1/0203
See application file for complete search history.

(56) References Cited

U.S. PATENT DOCUMENTS

| | | | | |
|---|---|---|---|---|
| 4,444,994 A * | 4/1984 | Baker | ................. | H05K 7/2039 174/16.3 |
| 5,812,374 A | 9/1998 | Shuff | | |
| 6,365,964 B1 * | 4/2002 | Koors | ................. | H05K 7/20436 257/713 |
| 7,120,027 B2 * | 10/2006 | Yatskov | .............. | H01L 23/4093 361/720 |
| 7,139,174 B1 * | 11/2006 | Nguyen | .............. | H01L 23/4006 361/709 |
| 7,193,851 B2 * | 3/2007 | Yatskov | ................ | H01L 23/467 257/E23.099 |
| 8,837,152 B2 * | 9/2014 | Chen | ................... | G11B 33/1426 174/548 |
| 2005/0185379 A1 | 8/2005 | Vinson et al. | | |
| 2013/0105112 A1 * | 5/2013 | Gan | ..................... | H01L 23/4093 165/67 |
| 2016/0106003 A1 | 4/2016 | Bosak et al. | | |

* cited by examiner

*Primary Examiner* — Zachary Pape
(74) *Attorney, Agent, or Firm* — Womble Bond Dickinson (US) LLP

(57) ABSTRACT

Described herein are cooling hardware and methods for cooling a heterogeneous computing architecture. In one embodiment, a system for cooling a heterogeneous computing architecture includes a base stiffener; a top stiffener including a mounting channel; a printed circuit board (PCB) including multiple electronics and chips, the PCB that is attached to the base stiffener; and a cooling device mounted on top of the top stiffener. One or more heat transfer plates (HTP) are inserted into the top stiffener via the mounting channel to transfer heat generated by the hardware modules to the cooling device, while resistance channels inside the top stiffener are designed for ensuring proper loading pressure on the entire assembly.

13 Claims, 11 Drawing Sheets

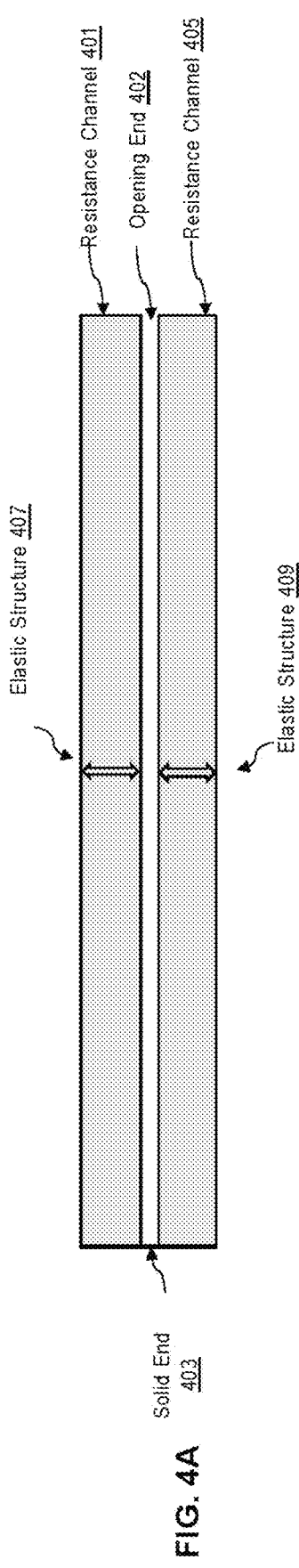
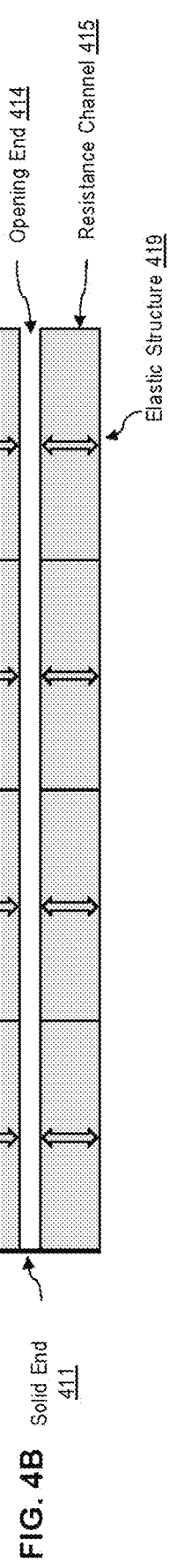
FIG. 4A
FIG. 4B

COOLING PACKAGES FOR HETEROGENOUS CHIPS

FIELD OF THE INVENTION

Embodiments of the present disclosure relate generally to cooling hardware and systems. More particularly, embodiments of the disclosure relate to cooling hardware and systems for heterogeneous computing architectures.

BACKGROUND

Heterogeneous computing refers to systems which use more than one type of processor or cores to maximize performance or energy efficiency. Heterogeneous computing architectures can achieve greater energy efficiency by combining processors with unconventional cores such as custom logic, field-programmable gate arrays (FPGAs) or general-purpose graphics processing units (GPUs).

Heterogeneous computing architectures present challenges to designs of accompanying cooling systems because the different types of hardware modules in a heterogeneous system may have different thermal design powers (TDP) and thermal specifications and requirements.

Some existing systems for cooling heterogeneous computing architectures use natural convection cooling systems, which need to be pre-attached to the dies and electronics thereon, such as high speed connectors and voltage regulators (VR). Other existing cooling systems use cooling devices that uniformly deliver cooling media (e.g., cooling air or cooling liquid) to each type of hardware modules in a heterogeneous computing architecture. The existing thermal systems are either costly or not flexible enough to accommodate the cooling needs of different types of hardware modules in a heterogeneous computing architecture. Especially given the constant changing of the heterogeneous hardware and chips, designing the cooling systems becomes more and more challenging.

BRIEF DESCRIPTION OF THE DRAWINGS

Embodiments of the invention are illustrated by way of example and not limitation in the figures of the accompanying drawings in which like references indicate similar elements.

FIGS. 4A-4B illustrate side views of two different implementations of a top stiffener according to an embodiment.

DETAILED DESCRIPTION

Figure 1:
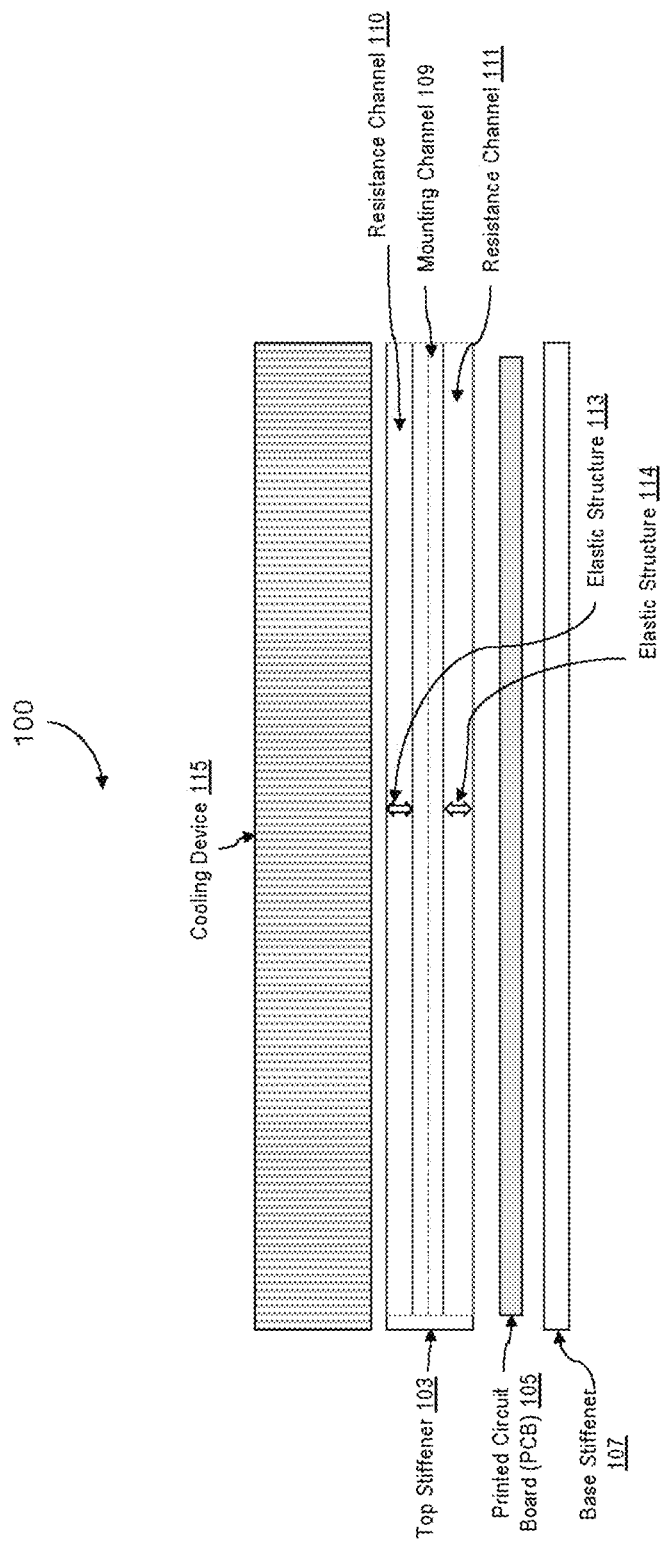
FIG. 1 illustrates a side view of a cooling system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

As described above, a heterogeneous computing architecture can include different types of hardware modules. As used herein, a hardware module in a heterogeneous computing architecture can be any hardware block on a printed circuit board in the heterogeneous computing architecture. Examples of the hardware modules can include a processor, e.g., central processing unit (CPU), a graphical processing unit (GPU); a core; a high bandwidth memory (HBM); a voltage regular (VR); a die; a security chip; a chiplet; a system in package (SIP); and a system on chip (SoC).

Each hardware module in a heterogeneous computing architecture may generate heat during operation, and the heat needs to be transferred to an external cooling device for dissipation. However, the hardware modules may have different cooling requirements, which cannot be satisfied using a single heat transfer plate. Further, the heterogeneous computing architecture may be constantly expanded with new hardware modules. The new hardware modules may require a different type of Heat Transfer Plate (HTP) from the existing HTPs installed for the heterogeneous computing architecture.

To address these issues, described herein are cooling systems and methods that can satisfy the cooling needs of different types of hardware modules in a heterogeneous computing architecture. In one embodiment, a system for cooling a heterogeneous computing architecture includes a base stiffener; a top stiffener including a mounting channel; a printed circuit board (PCB) including multiple hardware modules, the PCB on a substrate that is attached to the base stiffener; and a cooling device mounted on top of the top stiffener. One or more heat transfer plates (HTP) are inserted into the top stiffener via the mounting channel to transfer heat generated by the hardware modules to the cooling device.

In one embodiment, the one or more HTPs are inserted into the top stiffener via the mounting channel from the open end. Each of the HTPs has a mounting arm on each end. The mounting arms are used to mount the HTP on the top stiffener. One key feature is that the HTPs may be designed with different heat transfer technologies. The HTPs are selected based on cooling requirements of the hardware modules on the PCB. The HTPs include a vapor chamber, a thermoelectric cooler, and a copper heat transfer plate. A gap is provided between each pair of the HTPs to prevent heat from spreading between the pair of HTPs.

In one embodiment, each of the resistance channel includes one or more elastic structures to protect the one or more HTPs inserted into the top stiffener via the mounting channel.

In one embodiment, the top stiffener has four sides, with one side being a solid end or a closed end, one side being an open end, and each of the other two sides having two resistance channels. A first resistance channel on either of the other two sides is on top of the mounting channel, and a second resistance channel on either of the other two sides is below the mounting channel.

In one embodiment, the system further includes a stiffener mounting structure that assembles the top stiffener and the base stiffener; and a system mounting structure that assembles the cooling device, the top stiffener and the base stiffener.

In one embodiment, the hardware modules on the PCB can include one or more central processing units (CPU), one or more graphic processing units (GPU), one or more voltage regulators (VR), and one or more high bandwidth memories (HBM).

The various embodiments enable different types and/or technologies of HTPs to be integrated into the cooling system based on the cooling needs of the heterogeneous computing architecture without modifying the general framework of the cooling system. A new HTP can be inserted into the cooling system via a mounting channel when a newly hardware module is added to the PCB of the heterogeneous computing architecture without modifying other components of the cooling system, thus improving the expansion flexibility of the heterogeneous computing architecture.

Further, the various embodiments described herein can improve the reliability of the heterogeneous computing architecture by eliminating potential damages to the hardware modules on the PCB during the assembling process due to the use of elastic structures and the separation of different layers. The various embodiments can also increase the cooling performance of the heterogeneous computing architecture without increasing the cost of the cooling system.

FIG. 1 illustrates a side view of a cooling system 100 according to one embodiment. As shown in FIG. 1, the cooling system 100 includes a top stiffener 103, and a base stiffener 107. The top stiffener 103 includes a mounting channel 109, a top resistance channel 110, and a bottom resistance channel 111. The top resistance channel is on the top of the mounting channel 109, and the bottom resistance channel 111 is below the mounting channel 109. Each of the top stiffener 103 and the base stiffener 107 can be a frame stiffener.

As further shown, one side (e.g., the left side) of the top stiffener 103 can be a solid edge, which makes the top stiffener 103 closed on that side. The other side (e.g., the right side) of the top stiffener 103 is open, which allows one or more heat transfer plates (HTP) to be inserted into the top stiffener 103 through the mounting channel 109.

In one embodiment, one or more elastic structures 113 can be positioned at edges of the top resistance channel 110. Similarly, one or more elastic structures 114 can be positioned at edges of the bottom resistance channel 111. Each of the elastic structures 113 and 114 can provide proper cushion and proper pressure to the HTPs inserted into the top stiffener 103.

The cooling system 100 can further include a cooling device 115, which can be an air cooling heat sink or a liquid cooling cold plate. The HTPs inserted into the top stiffener 103 can transfer heat generated by hardware modules on a PCB 105 to the cooling device 115. It needs to be mentioned that the electronics which are packaged on the 105 are not shown in the figure.

Figure 2:
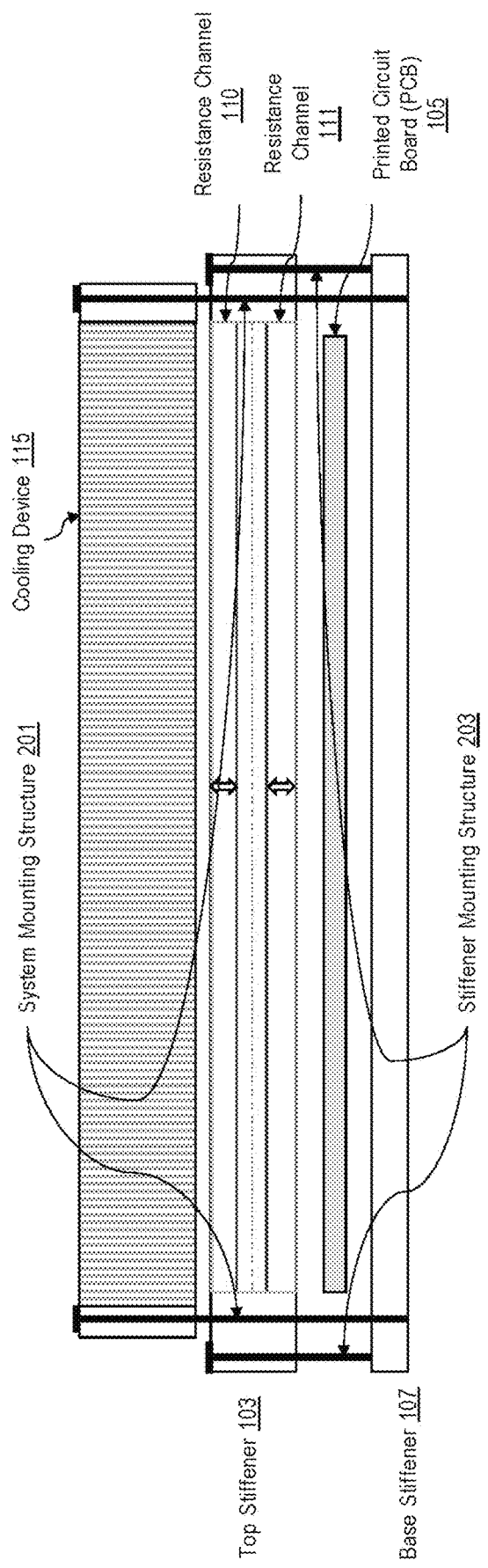
FIG. 2 further illustrates the cooling system according to one embodiment.

FIG. 2 further illustrates the cooling system 100 according to one embodiment. As shown in FIG. 2, the cooling system 100 can further include a stiffener mounting structure 203, which is used to assemble the top stiffener 103 and the base stiffener 107. The PCB 105, which are packaged with multiple different hardware modules, is sandwiched between the top stiffener 103 and the base stiffener 107.

The resistance channels 110 and 111 can ensure proper loading pressure on hardware modules on the PCB 105 using elastic structures in the resistance channels 110 and 111 such that the loading pressure does not damage the PCB 105 and the hardware modules. The hardware modules can be fragile, and could be damaged without proper protection against pressure exerted by components on top of the top stiffener 103, such as the cooling device 115. The two resistance channels 110 and 111 provide additional protection for the electronics as well as the HTPs during both the hardware integration process and normal operating.

In one embodiment, the cooling system 100 further includes a system mounting structure 201, which is used to assemble the external cooling device 115, the top stiffener 103, the base stiffener 107, and the PCB 105. The resistance channels 110 and 111 can ensure proper attachment and mounting pressure on the PCB 105 exerted by the cooling unit 115. In an embodiment, the mounting structures 201 and 203 and the resistance channels 110 and 111 function together to ensure proper pressure loaded between the surfaces of electronics and the HTPs, the HTPs and the cooling device 115.

Figure 3:
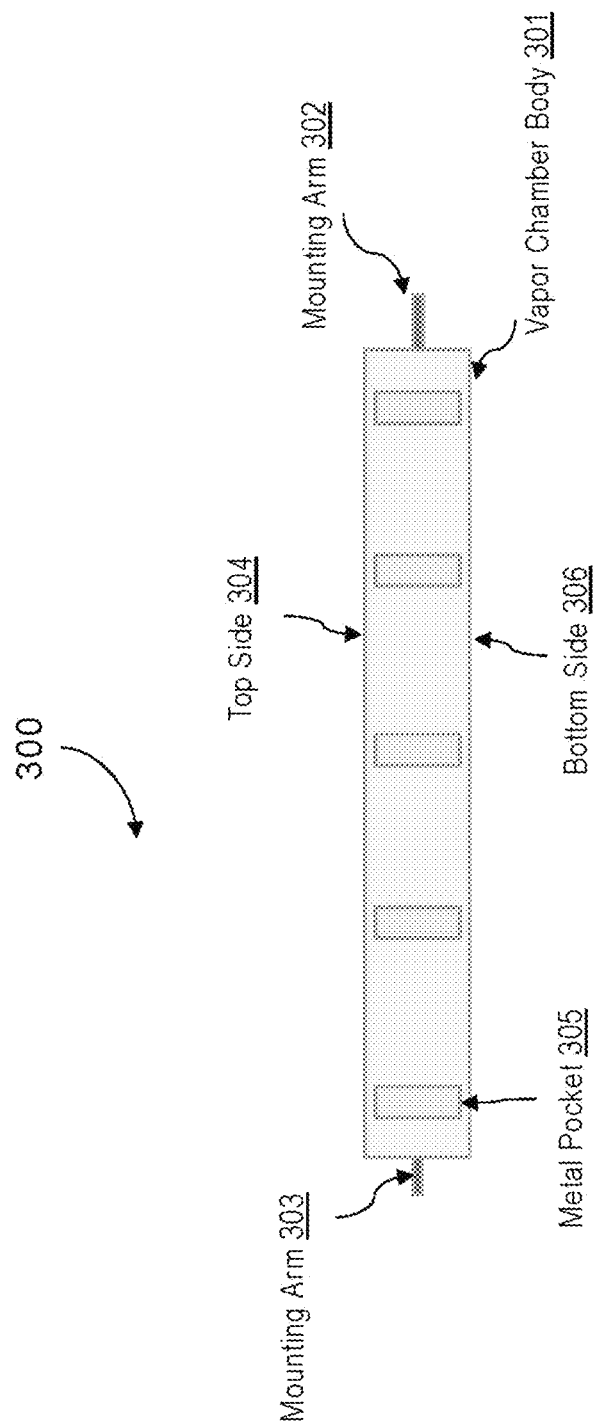
FIG. 3 illustrates a heat transfer plate according to one embodiment.

FIG. 3 illustrates a heat transfer plate 300 according to one embodiment. As shown, the heat transfer plate (HTP) 300 is a 3D vapor chamber, which is a two-phase device used to spread heat from a heat source to a cooling device. In this example, the heat source is one or more hardware modules on the PCB 105, and the cooling device is the cooling device 115 as described in FIG. 1.

In one implementation, the 3D vapor chamber can include multiple sealed metal pockets (e.g., meta pocket 305) filled with liquid. As the heat source heats the liquid in the metal pockets, the liquid will ensure that the heat is dissipated evenly to copper heat pipes (not shown) in the 3D vapor chamber 300, thus eliminating hot spots.

The main section of the 3D vapor chamber 300 is a main heat transfer body 301, with a bottom side 306 of the body 301 attached to the heat source and a top side 304 of the body 301 attached to the cooling device 115. Mounting arms 302 and 303 on both ends of the vapor chamber body 301 can be used to attach the vapor chamber body 301 to the top stiffener 103 as described in FIG. 1.

The heat transfer plate 300 can also be one of a variety of other types, including a thermoelectric cooler (TEC), and pure copper. It needs to be mentioned that the vapor chamber structure is fragile which means it may easily be squeezed when the pressure loaded exceeds the design specification. The vapor chamber will not function properly if deformation happens.

FIGS. 4A-4B illustrate side views of two different implementations of the top stiffener 103 according to an embodiment. For each implementation, the side view is a view of one of the two mounting sides of the top stiffener 103.

FIG. 4A shows that the top stiffener 103 is implemented as a single-section stiffener. The top stiffener in FIG. 4A has 4 sides. One side is a solid end or a closed end 403, one side is an open end 402, which allows HTPs to be inserted into the top stiffener. The other two sides are mounting sides for mounting HTPs inserted into the top stiffener. FIG. 4A shows one of the two mounting sides.

As an illustrative example, if the vapor chamber HTP 300 is to be inserted into the top stiffener 103 in FIG. 4A, each of the mounting arms 302 and 303 can be mounted on one of two mounting sides through the mounting channel.

The top stiffener includes two resistance channels 401 and 402 with elastic structures 407 and 409 to provide protection to the HTPs inserted into the top stiffener 103 and also provide protection to the PCB (e.g., the PCB 105 in FIG. 1) and hardware modules packaged on the PCB 105 when the top stiffener is assembled into the cooling system.

In one embodiment, the two resistance channels 401 and 405 can be on a physical entity, which can be inserted into the top stiffener 103. Then the HTPs can be inserted into the top stiffener 103 to be protected by the resistance channels 401 and 405.

FIG. 4B shows that the stiffener 103 is implemented as a multi-section stiffener. The top stiffener in FIG. 4B also has four sides. One side is a solid end or closed end 411, one side is an open end 414, which allows one or more HTPs to be inserted into the top stiffener. The other two sides are mounting sides for mounting HTPs inserted into the top stiffener.

The top stiffener includes two resistance channels 401 and 402, each resistance channel divided into multiple sections, and each section including one or more elastic structures. For example, one of the sections in the resistance channel 413 includes an elastic structure 417, and one of the sections in the resistance channel 415 includes an elastic structure 419.

In one embodiment, the multi-section implementation of the top stiffener 103 provides flexibility for inserting and assembling multiple HTPs. The elastic structures in both implementations can provide displacement redundancy in the vertical direction, and limit the maximum displacement in the vertical direction, as well as protecting HTPs inserted into the top stiffener. In an embodiment, each section of the resistance channel 413 or 415 as shown in FIG. 4B can be different to accommodate different HTP implementations and functions.

Figures 5A, 5B:
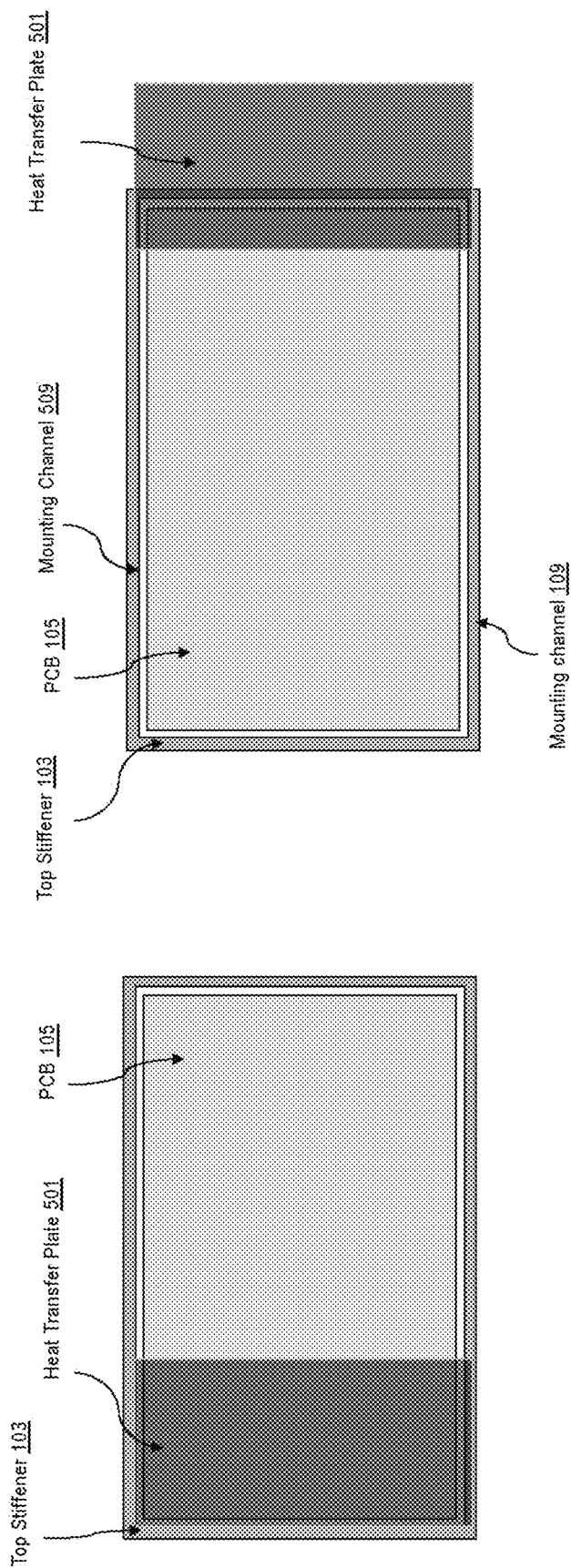
FIGS. 5A-5B illustrate top views of the cooling system according to one embodiment.

FIGS. 5A-5B illustrate top views of the cooling system 100 according to one embodiment. Each of the top views is a view of the cooling system 100 after the cooling device 115 is removed.

FIG. 5A shows a top view of the cooling system after an HTP 501 is inserted into the top stiffener 103. In this example, all hardware modules on the PCB 105 can use the HTP 501 to transfer heat to the cooling device 115.

FIG. 5B shows that the HTP 501 is being inserted into the top stiffener 103. As shown, the mounting channel 109 (as shown in FIG. 1) on one mounting side and a mounting channel 509 on the other mounting side can be used to insert the HTP 501.

Figure 6:
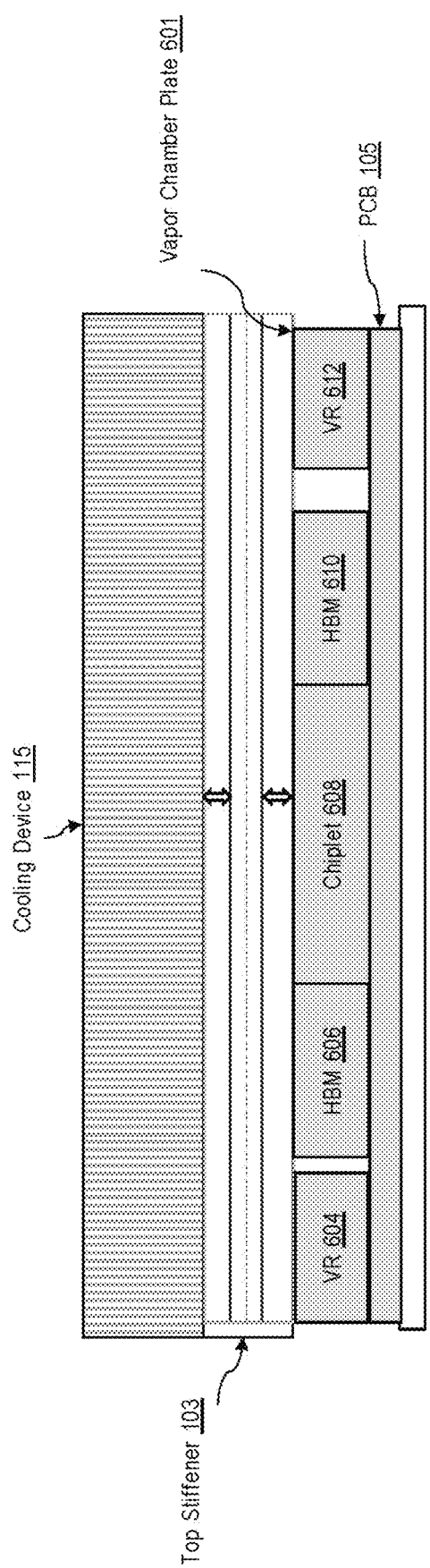
FIG. 6 illustrates that a vapor chamber based HTP is used in the entire cooling system according to one embodiment.

FIG. 6 illustrates that a vapor chamber based HTP 601 is used in the entire cooling system 100 according to one embodiment.

As shown, multiple hardware modules are packaged on the PCB 105. The hardware modules can be different type of chips or integrated circuit, as well as other auxiliary electronics. As one example in the figure, the hardware modules can include two voltage regulators (VR) 604 and 612, two high bandwidth memories 606 and 610, and one chiplet 608.

All the hardware modules packaged on the PCB 105 can use the vapor chamber based HTP 601 to transfer heat to the cooling device 115. The embodiment described in FIG. 6 can use the cooling device 115 for normal cooling workload, and for enhanced cooling workload. It can be seen the current design also enables ease of implementation of vapor chamber devices to high power heterogeneous electronics.

Figure 7A:
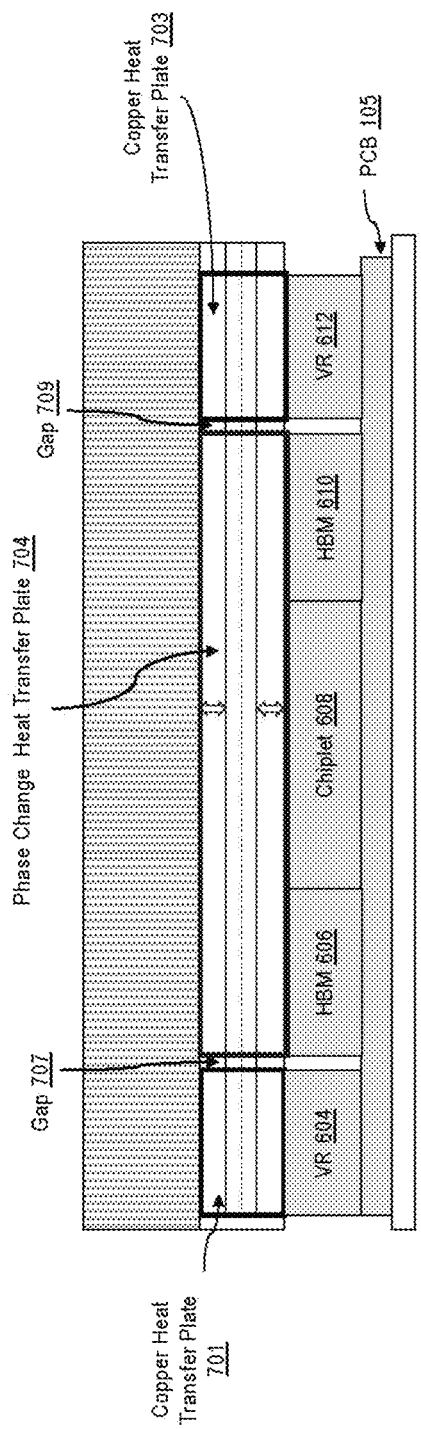
FIGS. 7A-7B further illustrate the cooling system according to one embodiment.
Figure 7B:
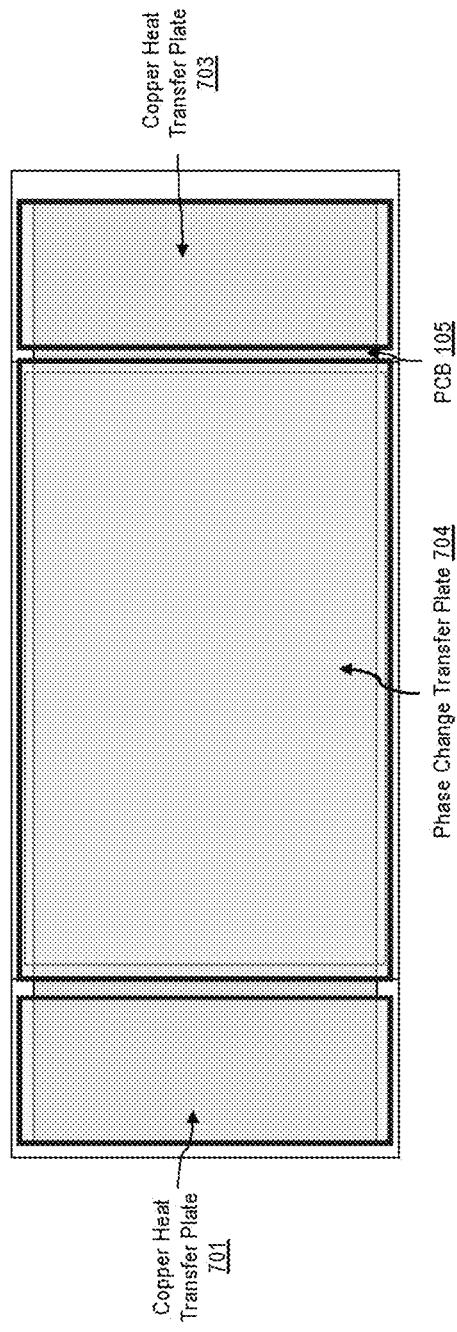

FIGS. 7A-7B further illustrate the cooling system 100 according to one embodiment. More specifically, FIGS. 7A-7B shows that that multiple HTPs of different types are used to match different types of hardware modules on the PCB 105.

FIG. 7A shows a side view of the cooling system 100, where a copper heat transfer plate 701 is inserted for the VR 701, and another copper heat transfer plate 703 is inserted for the VR 612. FIG. 7A also shows that a phrase change heat transfer plate 704 is inserted for the two HBMs 606 and 610, and the chiplet 608. The different HTPs are inserted to match the different cooling and packaging requirements of the hardware modules on the PCB 105.

As further shown in FIG. 7A, gaps 707 and 709 are preserved between different HTPs for thermal insulation, and for preventing heat from spreading between a pair of HTPs separated by the gap. FIG. 7B is a top view of the cooling system 100 shown in FIG. 7A.

Systems and methods described in this disclosure are for cooling heterogeneous architectures. Therefore, the cooling devices on the top layer and the HTPs can be different to accommodate different heterogeneous chip packages.

Figure 8:
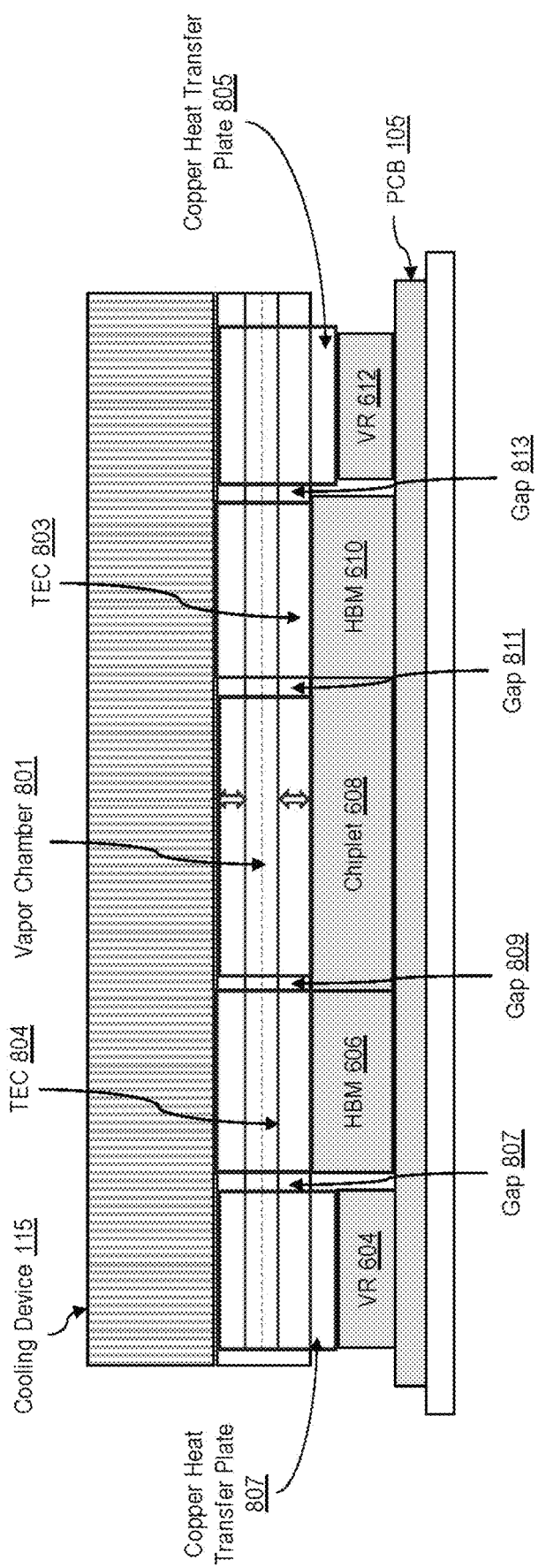
FIG. 8 further illustrates the cooling system according to one embodiment.

FIG. 8 further illustrates the cooling system 100 according to one embodiment. In this embodiment, a variety of HTPs are integrated to transfer heat generated by hardware modules/packages on the PCB 105 to the cooling device 115. The cooling device 115 can be a universal cooling plate or an air heat sink with uniform fins.

As shown in FIG. 8, the HTPs can include a copper heat transfer plate 805 for the VR 612, and another copper transfer plate 807 for the VR 604. The HTPs further include a vapor chamber 801 for the chiplet 608, and two TECs 803 and 804 respectively for the HBMs 610 and 606. The gaps 807, 809, 811 and 813 between the HTPs can provide thermal insulations between the HTPs.

Figure 9:
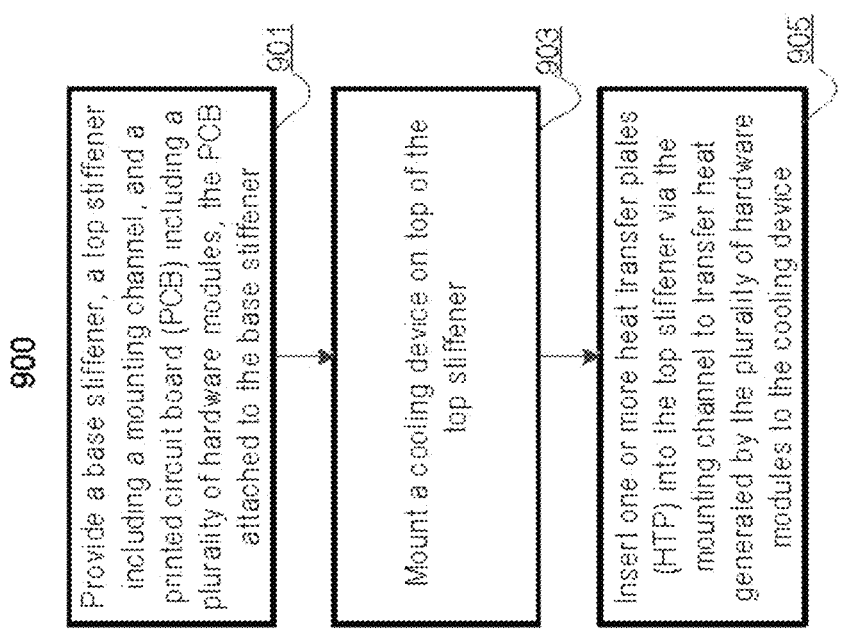
FIG. 9 illustrates a method of cooling a heterogeneous computing architecture according to one embodiment.

FIG. 9 illustrates a method 900 of cooling a heterogeneous computing architecture according to one embodiment. As shown in FIG. 9. in block 901, a base stiffener, a top stiffener including a mounting channel, and a printed circuit board (PCB) including a plurality of hardware modules are provided, and the PCB is attached to the base stiffener. In block 903, a cooling device is mounted on top of the top stiffener. The cooling device is either a cold plate or a heat sink. In block 905, one or more heat transfer plates (HTP) are into the top stiffener via the mounting channel to transfer heat generated by the plurality of hardware modules to the cooling device.

Figure 10:
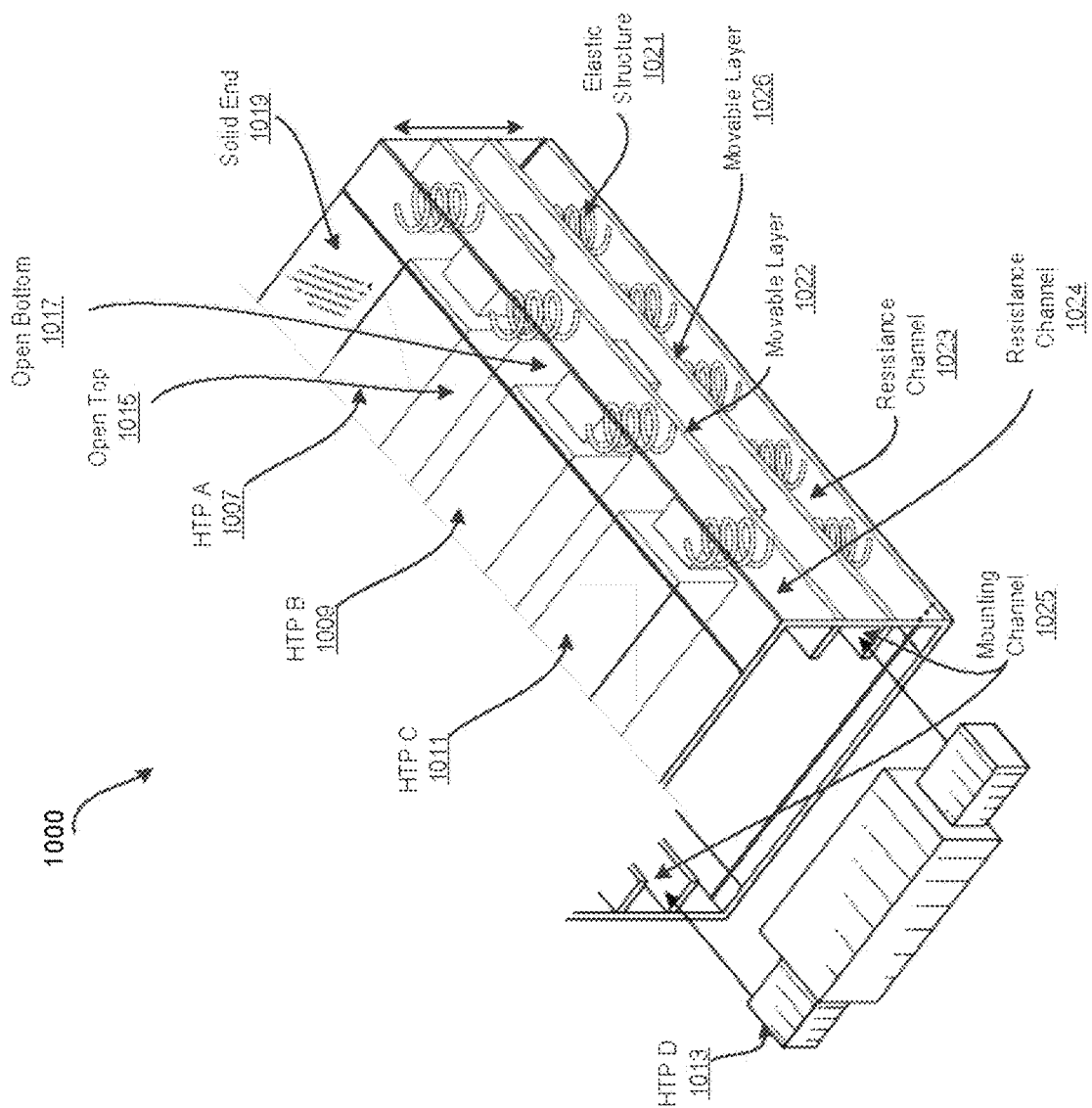
FIG. 10 is a 3D illustration of a top stiffener according to one embodiment.

FIG. 10 is a 3D illustration of a top stiffener 1000 according to one embodiment. The top stiffener 1000 is top-bottom symmetrical and left-right symmetrical. FIG. 10 only shows a portion of the top stiffener, primarily one side of the top stiffener 1000.

The top stiffener 1000 includes two resistance channels on each side. For example, the top stiffener 1000 includes a bottom resistance channel 1023 and a top resistance channel 1024 on the right side. Each resistance channel can include a number of elastic structures (e.g., an elastic structure 1021). A mounting channel 1025 can be used to insert an HTP D 1013 into the top stiffener 1000. The mounting channel 1025 includes two separate channels, with one channel between the two resistance channels on each side of the top stiffener 1000.

A movable layer 1022 can be the bottom of the top resistance channel 1024 and the top of the right side of the mounting channel 1025. Similarly, another movable layer 1026 can be the bottom of the right side of the mounting channel 1025 and the top of the bottom resistance channel 1023. Both movable parts 1022 and 1026 can be moved up and down to provide protection for the HTPs and/or hardware modules on a PCB.

As further shown, one end 1019 of the stop stiffener 1000 is solid, and the other end is open such HTPs (e.g., an HTP 1013) can be inserted into the top stiffener 1000. HTPs 1007, 1009, and 1011 represent different types of HTPs that have been inserted into the top stiffener 1000.

The top stiffener 1000 has a partial open bottom 1017 and a partial open top 1015 to allow direct contact between the electronics and HTP, and between cooling devices and HTP.

Figure 11:
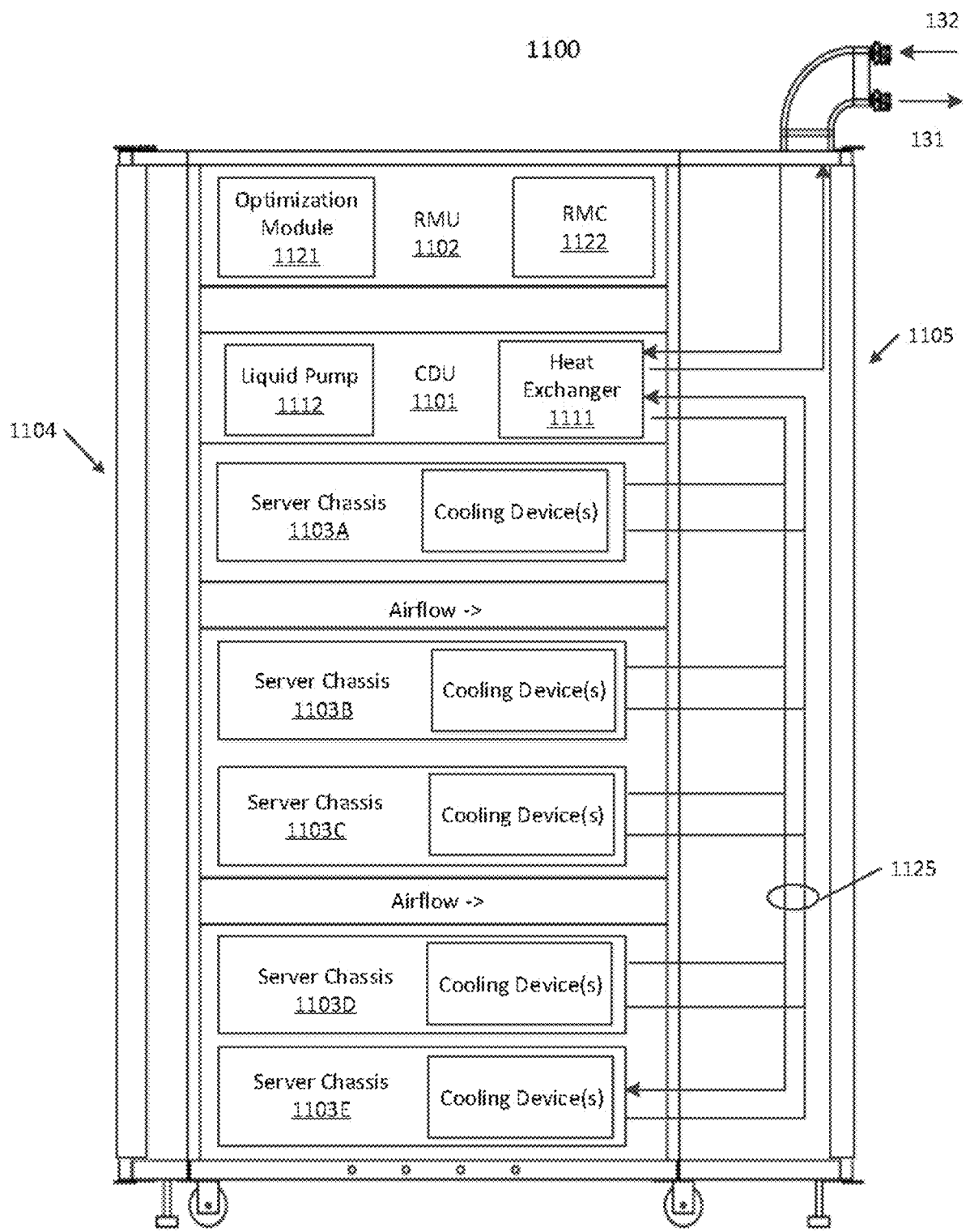
FIG. 11 is a block diagram illustrating an example of an electronic rack according to one embodiment.

FIG. 11 is block diagram illustrating an electronic rack according to one embodiment. Electronic rack 110 may represent any of the electronic racks of a data center. Referring to FIG. 11, according to one embodiment, electronic rack 1100 includes, but is not limited to, CDU 1101, rack management unit (RMU) 1102, and one or more server chassis 1103A-1103E (collectively referred to as server chassis 1103). Server chassis 1103 can be inserted into an array of server slots (e.g., standard shelves) respectively from frontend 1104 or backend 1105 of electronic rack 1100. Note that although there are five server chassis 1103A-1103E shown here, more or fewer server chassis may be maintained within electronic rack 1100. Also note that the particular positions of CDU 1101, RMU 1102, and/or server chassis 1103 are shown for the purpose of illustration only; other arrangements or configurations of CDU 1101, RMU 1102, and/or server chassis 1103 may also be implemented. In one embodiment, electronic rack 1100 can be either open to the environment or partially contained by a rack container, as long as the cooling fans can generate airflows from the frontend to the backend.

In addition, for at least some of the server chassis 1103, an optional fan module (not shown) is associated with the server chassis. Each of the fan modules includes one or more cooling fans. The fan modules may be mounted on the backends of server chassis 1103 or on the electronic rack to generate airflows flowing from frontend 1104, traveling through the air space of the sever chassis 1103, and existing at backend 1105 of electronic rack 1100.

In one embodiment, CDU 1101 mainly includes heat exchanger 1111, liquid pump 1112, and a pump controller (not shown), and some other components such as a liquid reservoir, a power supply, monitoring sensors and so on. Heat exchanger 1111 may be a liquid-to-liquid heat exchanger. Heat exchanger 1111 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 1105 of electronic rack 1100. The liquid supply/return lines 131-132, also referred to as room liquid supply/return lines, may be coupled to an external cooling system (e.g., a data center room cooling system).

In addition, heat exchanger 1111 further includes a second loop with two ports having a second pair of liquid connectors coupled to liquid manifold 1125 (also referred to as a rack manifold) to form a secondary loop, which may include a supply manifold (also referred to as a rack liquid supply line or rack supply manifold) to supply cooling liquid to server chassis 1103 and a return manifold (also referred to as a rack liquid return line or rack return manifold) to return warmer liquid back to CDU 1101. Note that CDUs 1101 can be any kind of CDUs commercially available or customized ones. Thus, the details of CDUs 1101 will not be described herein.

Each of server chassis 1103 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1103 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 1100 further includes optional RMU 1102 configured to provide and manage power supplied to servers 1103, and CDU 1101. RMU 1102 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 1100.

In one embodiment, RMU 1102 includes optimization module 1121 and rack management controller (RMC) 1122. RMC 1122 may include a monitor to monitor operating status of various components within electronic rack 1100, such as, for example, computing nodes 1103, CDU 1101, and the fan modules. Specifically, the monitor receives operating data from various sensors representing the operating environments of electronic rack 1100. For example, the monitor may receive operating data representing temperatures of the processors, cooling liquid, and airflows, which may be captured and collected via various temperature sensors. The monitor may also receive data representing the fan power and pump power generated by the fan modules and liquid pump 1112, which may be proportional to their respective speeds. These operating data are referred to as real-time operating data. Note that the monitor may be implemented as a separate module within RMU 1102.

Based on the operating data, optimization module 1121 performs an optimization using a predetermined optimization function or optimization model to derive a set of optimal fan speeds for the fan modules and an optimal pump speed for liquid pump 1112, such that the total power consumption of liquid pump 1112 and the fan modules reaches minimum, while the operating data associated with liquid pump 1112 and cooling fans of the fan modules are within their respective designed specifications. Once the optimal pump speed and optimal fan speeds have been determined, RMC 1122 configures liquid pump 1112 and cooling fans of the fan modules based on the optimal pump speeds and fan speeds.

As an example, based on the optimal pump speed, RMC 1122 communicates with a pump controller of CDU 1101 to control the speed of liquid pump 1112, which in turn controls a liquid flow rate of cooling liquid supplied to the liquid manifold 1125 to be distributed to at least some of server chassis 1103. Similarly, based on the optimal fan speeds, RMC 1122 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 11 is shown and described for the purpose of illustration only; other configurations or arrangements may also be applicable. For example, CDU 1101 may be an optional unit. The cold plates of server chassis 1103 may be coupled to a rack manifold, which may be directly coupled to room manifolds 131-132 without using a CDU. Although not shown, a power supply unit may be disposed within electronic rack 1100. The power supply unit may be implemented as a standard chassis identical or similar to a sever chassis, where the power supply chassis can be inserted into any of the standard shelves, replacing any of server chassis 1103. In addition, the power supply chassis may further include a battery backup unit (BBU) to provide battery power to server chassis 1103 when the main power is unavailable. The BBU may include one or more battery packages and each battery package include one or more battery cells, as well as the necessary charging and discharging circuits for charging and discharging the battery cells.

In one embodiment, the cooling devices disposed in each of the server chassis as shown may represent any cooling device described throughout this application.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C".

What is claimed is:

1. A system for cooling a heterogeneous computing architecture, comprising:
   a base stiffener;
   a top stiffener including a mounting channel, wherein the top stiffener includes a first side, a second side, a third side, and a fourth side, the first side being a closed end, the second side being an open end, and each of the third side and fourth side including two resistance channels, wherein a first resistance channel on either of the third side and fourth side is on top of the mounting channel, and wherein a second resistance channel on either of the third side and fourth side is below the mounting channel;
   a printed circuit board (PCB) including a plurality of hardware modules, the PCB attached to the base stiffener;
   a cooling device mounted on top of the top stiffener; and
   a plurality of heat transfer plates (HTPs) disposed in the mounting channel of the top stiffener, wherein each of the plurality of HTPs is separate from the cooling device, and is in contact with an external surface of each of one or more of the plurality of hardware modules to transfer heat generated by the plurality of hardware modules to the cooling device.

2. The system of claim 1, wherein the plurality of HTPs are inserted into the top stiffener via the mounting channel from the open end.

3. The system of claim 1, wherein each of the first resistance channel and the second resistance channel includes one or more elastic structures to protect the plurality of HTPs inserted into the top stiffener via the mounting channel.

4. The system of claim 1, further comprising:
   a stiffener mounting structure that assembles the top stiffener and the base stiffener; and
   a system mounting structure that assembles the cooling device, the top stiffener and the base stiffener.

5. The system of claim 1, wherein the cooling device is one of an air cooling device or a liquid cooling device.

6. The system of claim 1, wherein the plurality of hardware modules on the PCB include one or more central processing units (CPU), one or more graphic processing units (GPU), one or more voltage regulators (VR), and one or more high bandwidth memories (HBM).

7. The system of claim 1, wherein each of the plurality of HTPs has a mounting arm on each end, wherein the mounting arm on each end is used to mount the HTP on the top stiffener through the mounting channel.

8. The system of claim 1, wherein the plurality of HTPs include a plurality of different types of HTPs, and are selected based on cooling requirements of the plurality of hardware modules on the PCB.

9. The system of claim 1, wherein the plurality of HTPs includes a vapor chamber, a thermoelectric cooler, and a copper heat transfer plate.

10. The system of claim 1, further comprising a gap formed between the plurality of HTPs to prevent heat from spreading between the plurality of HTPs.

11. An electronic rack of a data center, comprising:
a plurality of server chassis arranged in a stack, each server chassis including
one or more servers and each server including a plurality of hardware modules mounted on a printed circuit board (PCB); and
a cooling system, including:
a base stiffener, wherein the PCB is attached to the base stiffener;
a top stiffener including a mounting channel, wherein the top stiffener includes a first side, a second side, a third side, and a fourth side, the first side being a closed end, the second side being an open end, and each of the third side and fourth side including two resistance channels, wherein a first resistance channel on either of the third side and fourth side is on top of the mounting channel, and wherein a second resistance channel on either of the third side and fourth side is below the mounting channel;
a cooling device mounted on top of the top stiffener; and
a plurality of heat transfer plates (HTPs) disposed in the mounting channel of the top stiffener, wherein each of the plurality of HTPs is separate from the cooling device, and is in contact with an external surface of each of one or more of the plurality of hardware modules to transfer heat generated by the plurality of hardware modules to the cooling device.

12. The electronic rack of claim 11, wherein the plurality of HTPs are inserted into the top stiffener via the mounting channel from the open end.

13. The electronic rack of claim 11, wherein each of the first resistance channel and the second resistance channel includes one or more elastic structures to protect the plurality of HTPs inserted into the top stiffener via the mounting channel.

* * * * *